(12) United States Patent
Tan et al.

(10) Patent No.: US 11,581,294 B2
(45) Date of Patent: Feb. 14, 2023

(54) OPTOELECTRONIC DEVICE WITH LIGHT-EMITTING DIODES

(71) Applicant: Aledia, Grenoble (FR)

(72) Inventors: Wei Sin Tan, Meylan (FR); Philippe Gilet, Teche (FR); Eric Pourquier, Grenoble (FR); Zine Bouhamri, Grenoble (FR); Pamela Rueda Fonseca, Grenoble (FR)

(73) Assignee: Aledia, Echirolles (FR)

( * ) Notice: Subject to any disclaimer, the term of this patent is extended or adjusted under 35 U.S.C. 154(b) by 56 days.

(21) Appl. No.: 16/626,297

(22) PCT Filed: Jun. 21, 2018

(86) PCT No.: PCT/EP2018/066667
§ 371 (c)(1),
(2) Date: Dec. 23, 2019

(87) PCT Pub. No.: WO2019/002101
PCT Pub. Date: Jan. 3, 2019

(65) Prior Publication Data
US 2020/0161285 A1 May 21, 2020

(30) Foreign Application Priority Data
Jun. 30, 2017 (FR) ..................................... 1756148

(51) Int. Cl.
*H01L 25/16* (2006.01)
*H01L 25/075* (2006.01)
(Continued)

(52) U.S. Cl.
CPC ........ *H01L 25/167* (2013.01); *H01L 25/0756* (2013.01); *H01L 27/156* (2013.01); *H01L 33/24* (2013.01)

(58) Field of Classification Search
CPC ......... H01L 33/08; H01L 33/24; H01L 33/62; H01L 25/167; H01L 25/0756; H01L 27/156
See application file for complete search history.

(56) References Cited

U.S. PATENT DOCUMENTS

2010/0302775 A1* 12/2010 Hata ..................... H01S 5/4025
257/89
2014/0054618 A1* 2/2014 Li .......................... H01L 33/08
257/98

(Continued)

OTHER PUBLICATIONS

International Search Report and Written Opinion for International Application No. PCT/EP2018/066667, dated Sep. 13, 2018.

*Primary Examiner* — Aaron J Gray
(74) *Attorney, Agent, or Firm* — Wolf, Greenfield & Sacks, P.C.

(57) ABSTRACT

An optoelectronic device including: a first circuit including a substrate having first and second opposite faces, the first circuit having display pixels, each display pixel having, on the side of the first face, a first light-emitting diode having a first active region adapted to emit a first radiation and, extending from the second face, a second light-emitting diode having a second active region adapted to emit a second radiation, the surface area, viewed from a direction orthogonal to the first face, of the first active region being at least twice as big as the surface area, viewed from the direction, of the second active region; and a second circuit bonded to the first circuit on the side of the first light-emitting diode and electrically linked to the first and second light-emitting diodes.

14 Claims, 11 Drawing Sheets

(51) Int. Cl.
 H01L 27/15 (2006.01)
 H01L 33/24 (2010.01)

(56) References Cited

U.S. PATENT DOCUMENTS

| | | | |
|---|---|---|---|
| 2017/0092691 A1* | 3/2017 | Tso | H01L 23/53228 |
| 2017/0133356 A1* | 5/2017 | Mercier | H01L 33/24 |
| 2017/0170373 A1 | 6/2017 | Peng et al. | |
| 2018/0175107 A1* | 6/2018 | Nayak | H01L 33/0029 |
| 2019/0189596 A1* | 6/2019 | Chae | H01L 33/08 |

* cited by examiner

OPTOELECTRONIC DEVICE WITH LIGHT-EMITTING DIODES

RELATED APPLICATIONS

This Application is a national stage filing under 35 U.S.C. § 371 of International Patent Application Serial No. PCT/EP2018/066667, filed Jun. 21, 2018, which claims priority to French patent application FR 17/56148. The contents of these applications are incorporated herein by reference in their entirety.

BACKGROUND

The present disclosure relates to an optoelectronic device, particularly a display screen or an image projection device, with light-emitting diodes based on semiconductor materials and their manufacturing methods.

DISCUSSION OF THE RELATED ART

A pixel of an image corresponds to the unit element of the image displayed by an optoelectronic device. When the optoelectronic device is a color image display optoelectronic device, it generally comprises for the display of each pixel of the image at least three components, also called display sub-pixels, which each emit a light radiation substantially in a single color (for example, red, green, and blue). The superimposing of the radiations emitted by the three display sub-pixels provides the observer with the color sensation corresponding to the pixel of the displayed image. In this case, the assembly formed by the three sub-display pixels used to display a pixel of an image is called a display pixel.

There exist optoelectronic devices comprising light-emitting diodes based on semiconductor materials, each diode comprising a stack of semiconductor layers for example mainly comprising at least one group-III element and one group-V element, called III-V compound hereafter, particularly gallium nitride (GaN), or mainly comprising at least one group-II element and one group-VI element, particularly zinc oxide (ZnO), called II-VI compound hereafter.

For some applications, it is desirable that the lateral dimensions of the display pixel, also called pixel pitch, is less than 10 µm. However, known light-emitting diodes comprising a stack of semiconductor layers, for example comprising a III-V or II-VI compound, show poor internal quantum efficiency (IQE) for conventional III-V or II-VI based structures, in particular when the pixel pitch is less than 10 µm due to surface recombination effects, and in particular the red LED. Moreover, the manufacture of efficient red, green and blue display pixels by epitaxy steps can be complex.

SUMMARY

An object of an embodiment aims at overcoming all or part of the disadvantages of the previously-described optoelectronic devices comprising light-emitting diodes.

Another object of an embodiment is that the internal quantum efficiency of the red light-emitting diodes of the optoelectronic device is increased.

Another object of an embodiment is that the light-emitting diodes comprise a stack of semiconductor layers, for example mainly comprising a III-V or II-VI compound.

Another object of an embodiment is that the pixel pitch of the optoelectronic device is less than 10 µm.

Another object of an embodiment is to simplify the method of manufacturing the optoelectronic device implementing epitaxy steps.

Another object of an embodiment is that the optoelectronic device can be manufactured at an industrial scale and at a low cost.

Thus, an embodiment provides an optoelectronic device comprising:

a first circuit comprising a substrate comprising first and second opposite faces, the first circuit comprising display pixels, each display pixel comprising, on the side of the first face, a first light-emitting diode comprising a first active region adapted to emit a first radiation and, extending from the second face, a second light-emitting diode comprising a second active region adapted to emit a second radiation, the surface area, viewed from a direction orthogonal to the first face, of the first active region being at least twice as big as the surface area, viewed from said direction, of the second active region; and a second circuit bonded to the first circuit on the side of the first light-emitting diode and electrically linked to the first and second light-emitting diodes.

According to an embodiment, the first light-emitting diode has a planar structure.

According to an embodiment, the second light-emitting diode has a tridimensional structure.

According to an embodiment, the second light-emitting diode has a planar structure.

According to an embodiment, the first circuit further comprises an electrically conductive layer covering the second light-emitting diode and electrically connected to the second light-emitting diode.

According to an embodiment, the substrate comprises an opening, the electrically conductive layer being electrically connected to the first light-emitting diode at the bottom of the opening.

According to an embodiment, the first light-emitting diode and the second light-emitting diode comprise at least one quantum well.

According to an embodiment, each display pixel comprises an electrically conductive element extending from the first face through at least part of the substrate and electrically linked to the second light-emitting diode and to the second circuit.

According to an embodiment, each display pixel further comprises a wall at least partially made of a reflecting material at least for the second radiation, said wall delimiting an opening opposite to the second light-emitting diode.

According to an embodiment, each display pixel further comprises a photoluminescent block opposite to the second light-emitting diode.

According to an embodiment, the second light-emitting diode extends at least partly through the substrate.

According to an embodiment, each display pixel further comprises, extending from the second face, a third light-emitting diode comprising a third active region adapted to emit a third radiation, the surface area, viewed from a direction orthogonal to the first face, of the first active region being at least twice as big as the surface area, viewed from said direction, of the third active region.

According to an embodiment, the first wavelength is in the range from 600 nm to 720 nm, the second wavelength is in the range from 510 nm to 570 nm and the third wavelength is in the range from 430 nm to 490 nm.

According to an embodiment, the surface area, viewed from a direction orthogonal to the first face, of the first active region is at least five times as big as the surface area, viewed from said direction, of the second active region.

An embodiment also provides a method of manufacturing an optoelectronic device comprising the steps of:

a) forming a first circuit comprising a substrate comprising first and second opposite faces, the first circuit comprising display pixels, each display pixel comprising, on the side of the first face, a first light-emitting diode comprising a first active region adapted to emit a first radiation and, extending from the second face, a second light-emitting diode comprising a second active region adapted to emit a second radiation, the surface area, viewed from a direction orthogonal to the first face, of the first active region being at least twice as big as the surface area, viewed from said direction, of the second active region; and b) bonding a second circuit to the first circuit on the side of the first light-emitting diode, the second circuit being, after step b), electrically linked to the first and second light-emitting diodes.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
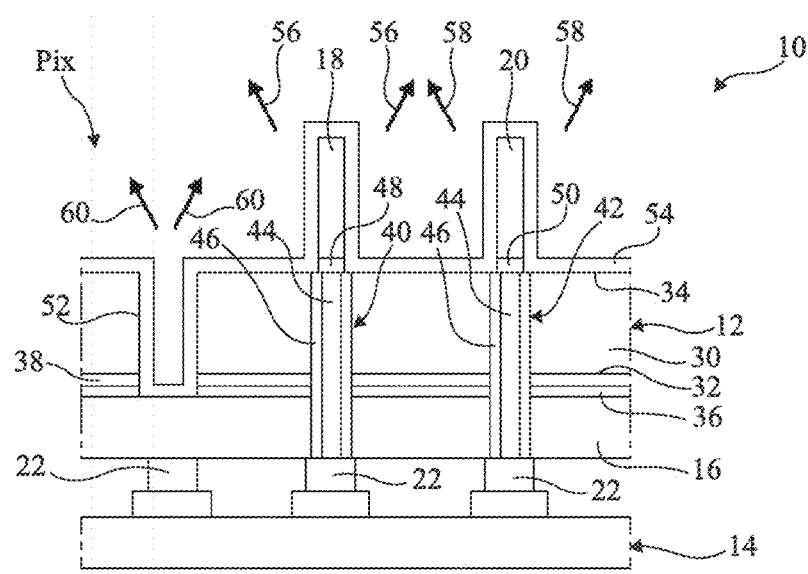
FIGS. 1 and 2 are respectively a partial simplified cross-section view and a partial simplified top view of an embodiment of an optoelectronic device.

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the circuits for controlling a light-emitting diode of an optoelectronic device are well known and will not be described in detail.

In the following description, unless otherwise indicated, terms "substantially", "approximately", and "in the order of" mean "to within 10%". Moreover, "active region" of a light-emitting diode designates the region of the light-emitting diode from which most of the electromagnetic radiation provided by the light-emitting diode is emitted. Further, when a first element is said to be linked to a second element by an epitaxial relationship, this means that the first element is made from a first layer and the second element is made from a second layer that is grown by epitaxy on the first layer or inversely.

A light-emitting diode is said to have a planar structure or a bidimensional structure when the active region of the light-emitting diode is formed over a planar layer. A light-emitting diode is said to have a tridimensional structure when the active region of the light-emitting diode covers a tridimensional element, for example a microwire or a nanowire.

Term "microwire" or "nanowire" designates a three-dimensional structure of elongated shape along a preferred direction, having at least two dimensions, called minor dimensions, in the range from 5 nm to 5 µm, preferably from 100 nm to 2 µm, the third dimension, called major dimension, being greater than or equal to 1 time, preferably greater than or equal to 3 times, and more preferably still greater than or equal to 5 times, the largest minor dimension. In certain embodiments, the minor dimensions may be smaller than or equal to approximately 5 µm, preferably in the range from 100 nm to 5 µm, more preferably from 200 nm to 1.5 µm. In certain embodiments, the height of each microwire or nanowire may be greater than or equal to 500 nm, preferably in the range from 1 µm to 50 µm. In the following description, term "wire" is used to mean "microwire or nanowire".

The cross-section of the wires may have different shapes, such as, for example, an oval, circular, or polygonal shape, particularly triangular, rectangular, square, or hexagonal. It should thus be understood that term "diameter" mentioned in relation with a cross-section of a wire designates a quantity associated with the surface area of the wire in this cross-section, corresponding, for example, to the diameter of the disk having the same surface area as the wire cross-section.

According to an embodiment, for each display pixel of the optoelectronic device, the red light-emitting diode is covered by the other light-emitting diodes so that the surface area of the active region of the light-emitting diode can be made bigger than the surface areas of the active regions of the other light-emitting diodes, for example as big as the surface area of the display pixel. Therefore, the quantum efficiency of the red light-emitting diode remains high, for example higher than 10%, even when the pixel pitch is inferior to 10 µm.

Figure 2:
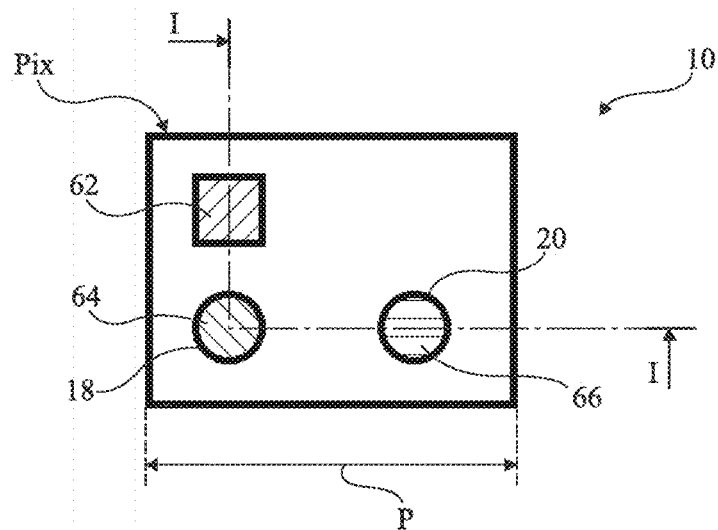

FIGS. 1 and 2 show an embodiment of a display pixel Pix of an optoelectronic device 10, for example corresponding to a display screen or to an image projection device.

Device 10 comprises two integrated circuits 12, 14. First integrated circuit 12 comprises, for each display pixel Pix at least three light-emitting diodes 16, 18, 20 and is called optoelectronic circuit or optoelectronic chip in the following description. Second integrated circuit 14 comprises electronic components, not shown, especially transistors, used to control light-emitting diodes 16, 18, 20 of optoelectronic chip 12. Second integrated circuit 14 is called control circuit or control chip in the following description. Optoelectronic circuit 12 is bonded to control circuit 14. According to the bonding type, bonding pads 22 may be present between optoelectronic chip 12 and control chip 14.

In an embodiment, optoelectronic chip 12 comprises for each display pixel Pix:

a substrate 30 having two opposite, preferably planar, faces 32, 34;

first light-emitting diode 16 covered by a reflecting layer 36 on the side of face 32, and linked to face 32 by a bonding medium 38;

vertical isolated trenches 40, 42 crossing substrate 30 from face 32 to face 34 and crossing light-emitting diode 16, in contact at one end with bonding pads 22, vertical isolated trench 40 being electrically linked at the other end with light-emitting diode 18 and vertical isolated trench 42 being electrically linked at the other end with light-emitting diode 20, each vertical isolated trench 40, 42 comprising an electrically conducting core 44 separated from substrate 30 and light-emitting diode 16 by an electrically insulating wall 46;

two seed pads 48, 50 on the ends of vertical isolated trenches 40, 42 on the side of face 34;

second light-emitting diode 18 on seed pad 48;

third light-emitting diode 20 on seed pad 50;

an opening 52 crossing through substrate 30 from face 32 to face 34; and an electrically conductive layer 54 covering second and third light-emitting diodes 18, 20, face 34 between second and third light-emitting diodes 18, 20, and the walls of opening 52 and in contact with first light-emitting diode 18 at the bottom of opening 52.

The optoelectronic device 12 can comprise an additional vertical isolated trench, not shown, crossing through substrate 30 and light-emitting diode 16 and in contact at one end with a bonding pad 22 and in contact at the opposite end with conductive layer 54.

As a variation, trenches 40, 42 may not cross the light-emitting diode 16 and the optoelectronic circuit 12 can comprise openings crossing the light-emitting diode 16 and exposing ends of trenches 40, 42, the pads 22 contacting the trenches 40, 42 through the openings.

In the present embodiment, light-emitting diodes 18, 20 have a tridimensional structure and light-emitting diode 16 has a planar structure. Moreover, in the present embodiment, conductive layer 54 is a common electrode for light-emitting diodes 16, 18, 20.

In operation, voltages are applied between conductive pads 22 linked to light-emitting diodes 16, 18, 20 and conductive layer 54, so that, for each pixel Pix, the active region of each light-emitting diode 16, 18, 20 emits light with an intensity that depends on the voltage or current applied between conductive pad 22 associated with said light-emitting diode 16, 18, 20 and conductive layer 54. In the present embodiment, display pixels Pix can be arranged in an array and active matrix addressing scheme can be performed.

Light emitted by light-emitting diodes 18, 20 escapes upwards in FIG. 1 as shown by arrows 56, 58. Light emitted by light-emitting diode 16 escapes from optoelectronic chip 12 through opening 52 as shown by arrows 60. Reflective layer 36 allows light emitted by the active region of light-emitting diode 16 to be guided in light-emitting diode 16 up to opening 52. A reflecting layer, not shown, can be present on the face of light-emitting diode 16 in contact with bonding pads 22 or on the face of control circuit 14 facing optoelectronic circuit 12 to increase the wave guiding effect in light-emitting diode 16. As a variation, reflecting layer 36 may not be present. In the present embodiment, substrate 30 can be opaque to the light emitted by light-emitting diode 16.

FIG. 2 is a top view of display pixel Pix and schematically shows by hatched areas 62, 64, 66 the areas of pixel Pix from which light, emitted respectively by light-emitting diodes 16, 18, 20, escapes from pixel Pix. In the present embodiment, display pixel Pix has, in top view, a circle, triangle, hexagonal, square or rectangular shape. The pixel pitch P can correspond to the longest side of the rectangle in which display pixel Pix is inscribed in top view. The pixel pitch P can be ranging from 3 µm to 100 µm. In an embodiment, the surface area view from a direction orthogonal to face 32 of the active region of light-emitting diode 16 is at least twice, preferably at least five times, most preferably at least ten times, as big as the surface area view from said direction of the active region of light-emitting diode 18 or 20. In an embodiment, the surface area view from a direction orthogonal to face 32 of the active region of light-emitting diode 16 is substantially equal to the surface area of display pixel Pix. In an embodiment, in top view of FIG. 2, each area 62, 64, 66 can be inscribed in a circle having a diameter ranging from 1 µm to 100 µm, preferably from 3 µm to 15 µm. The configuration of both bidimensional light-emitting diode 16 and tridimensional light-emitting diode 18, 20 integrated together allows a finer pixel pitch P to be achieved.

In an embodiment, light-emitting diode 16 is adapted to emit light at a first wavelength by electrical pumping. Light-emitting diode 18 is adapted to emit light at a second wavelength by electrical pumping. Light-emitting diode 20 is adapted to emit light at a third wavelength by electrical pumping. In an embodiment, first, second and third wavelengths are different. In an embodiment, the first wavelength corresponds to red light and is in a range from 600 nm to 720 nm. In an embodiment, the second wavelength corresponds to green light and is in the range from 510 nm to 570 nm. In an embodiment, the third wavelength corresponds to blue light and is in the range from 430 nm to 490 nm.

In an embodiment, each pixel Pix of optoelectronic circuit 12 comprises an additional light-emitting diode on face 34, having a general structure analog to adapted to light-emitting diodes 18, 20, and adapted to emit light at a fourth wavelength by electrical pumping. In an embodiment, fourth wavelength corresponds to yellow light and is in a range from 570 nm to 600 nm.

Figure 3:
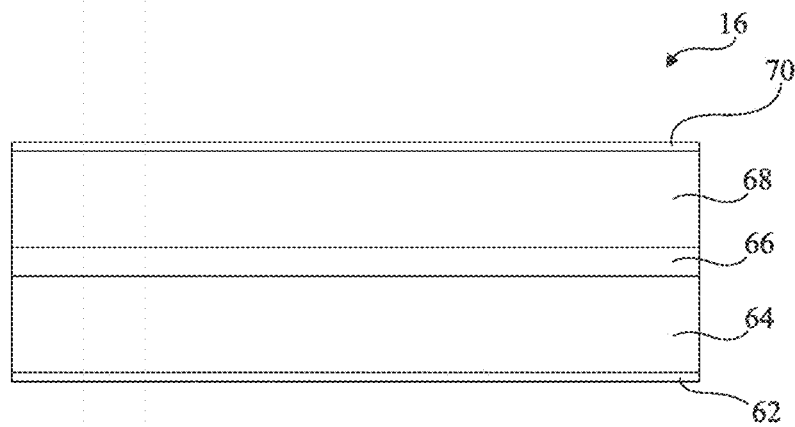
FIGS. 3 and 4 are partial simplified cross-section views respectively of a planar light-emitting diode and of a tridimensional light-emitting diode.

FIG. 3 shows an embodiment of planar light-emitting diode 16.

Light-emitting diode 16 comprises, from the bottom to the top in FIG. 3:

a first electrode layer 62, for example a metallic electrode;

a semiconductor layer 64 of a semiconductor material doped with a first conductivity type in contact with electrode 62;

an active region 66 having the shape of a layer covering semiconductor layer 64 and in contact with semiconductor layer 64;

a semiconductor layer 68 of the semiconductor material doped with a second conductivity type opposite to the first conductivity type and covering active region 66 and in contact with active region 66; and a second electrode layer 70, for example a metallic electrode, covering the semiconductor layer 68 and in contact with semiconductor layer 68.

Second electrode 70 can correspond to the reflecting layer 36 disclosed before.

Figure 4:
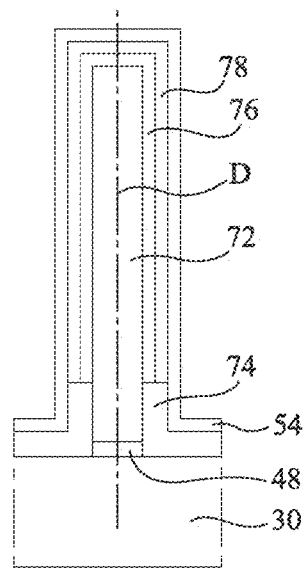

FIG. 4 shows an embodiment of tridimensional light-emitting diode 18. Light-emitting diode 20 can have the same structure.

Light-emitting diode 18 comprises, from the bottom to the top in FIG. 4:

a three-dimensional semiconductor element 72, which in the present embodiment correspond to a wire of axis D, comprising a lower portion, doped of a first conductivity type, for example of N type, in contact with seed pad 48, and an upper portion, doped with the first conductivity type or unintentionally doped;

an electrically insulating layer 74 covering the side walls of the lower portion of wire 72 and extending between conductive layer 54 and substrate 30;

an active region 76 covering the upper portion of wire 72; and a semiconductor layer 78 of a second type of conductivity opposite to the first conductivity type, overlying the active region 76.

Conductive layer 54 covers semiconductor layer 78 and is in contact with semiconductor layer 78. As a variation, insulating layer 74 can be present only around the side walls of the lower portion of wire 72. In that case, an electrically insulating layer is interposed between substrate 30 and conductive layer 50 and comprises an opening in which seed pad 48 is formed. As a variation, insulating layer 74 can partially cover semiconductor layer 78. Insulating layer 74 can be formed before or after semiconductor layer 78.

Substrate 30 is at least partly made of at least one semiconductor material or an electrically insulating material. The semiconductor material may be silicon, germanium, silicon carbide, a III-V compound, a II-VI compound, or a combination of at least two of these compounds. An example of insulating material is sapphire.

Substrate 30, wires 72 and semiconductor layers 64, 68, 78, and active layers 66, 76 may be at least partly made of semiconductor materials mainly comprising a III-V compound, for example, a III-N compound or phosphide-based compound. Examples of group-III elements comprise gallium (Ga), indium (In), or aluminum (Al). Examples of III-N compounds are GaN, AlN, InN, InGaN, AlGaN, or AlInGaN. Examples of phosphide-based elements comprise aluminium (Al), gallium (Ga), indium (In) and phosphorus (P). Examples of phosphide-based compounds are AlInGaP, InGaP, GaP, or AlGaP. The phosphide based compounds can be grown on a GaAs based host substrate, and the GaAs host substrate subsequently removed post-growth to prevent absorption. Other group-V elements may also be used, for example, phosphorus or arsenic. Generally, the elements in the III-V compound may be combined with different molar fractions.

Substrate 30, wires 72 and semiconductor layers 64, 68, 78, and active layers 66, 76 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

The thickness of substrate 30 is in the range from 0 to 1 mm, preferably from 10 μm to 1 mm. The thickness of light-emitting diode 16 is in the range from 0.1 μm to 1 mm.

Seed pads 48, 50 are made of a material favoring the growth of wires 72. As an example, the material forming seed pads 48, 50 may be a nitride, a carbide, or a boride of a transition metal from column IV, V, or VI of the periodic table of elements or a combination of these compounds. As an example, seed pads 48, 50 may be made of aluminum nitride (AlN), of boron (B), of boron nitride (BN), of titanium (Ti), or titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate ($ZrB_2$), of zirconium nitride (ZrN), of silicon carbide (SiC), of tantalum nitride and carbide (TaCN), of magnesium nitride in $Mg_xN_y$ form, where x is approximately equal to 3 and y is approximately equal to 2, for example, magnesium nitride according to form $Mg_3N_2$ or magnesium gallium nitride (MgGaN), of tungsten (W), of tungsten nitride (WN), or of a combination thereof. Seed pads 48, 50 may be doped with the same conductivity type as substrate 30. Each seed pad 48, 50 may have a monolayer structure or may correspond to a stack of two layers or of more than two layers. Seed pads 48, 50 may be replaced with a seed layer.

Active region 66 of light-emitting diode 16 is the layer having most of the radiation supplied by light-emitting diode 16 emitted therefrom. According to an example, active region 66 may comprise confinement means. Active region 66 may comprise a single quantum well, multiple quantum wells or a double heterostructure. It may then comprise a semiconductor material different from the semiconductor material forming semiconductor layers 64 and 68 and having a bandgap smaller than that of semiconductor layers 64 and 68. Active region 66 may comprise multiple quantum wells. It then comprises a stack of semiconductor layers forming an alternation of quantum wells and of barrier layers. Active region 76 may comprise a single quantum well, multiple quantum wells or a double heterostructure as disclosed before for active region 66.

Conductive layer 54 may be made of a transparent and conductive material such as graphene or a transparent conductive oxide (TCO), for example, indium tin oxide (ITO), gallium zinc oxide (GZO) or aluminum zinc oxide (AZO). As an example, conductive layer 54 has a thickness in the range from 5 nm to 1000 nm, preferably from 20 nm to 50 nm. Reflecting layer 36 is for example a metallic layer or a distributed Bragg reflector.

Conductive cores 44 and electrode layers 62, 70 are made of a conductive material, for example a metal such as aluminum, silver, copper, or zinc.

Insulating walls 46 and insulating layer 74 may be made of a dielectric material, for example, of silicon oxide ($SiO_2$), of silicon nitride ($Si_xN_y$, where x is approximately equal to 3 and y is approximately equal to 4, for example, $Si_3N_4$), of silicon oxynitride (particularly of general formula $SiO_xN_y$, for example, $Si_2ON_2$), of aluminum oxide ($Al_2O_3$) or of hafnium oxide ($HfO_2$), or a combination of these dielectric materials.

Bonding medium 38 can be dielectric based material (i.e $SiO_2$ to $SiO_2$), a metal eutectic based material (i.e AuSn, CuSn) or a metal-metal based material (i.e. Cu to Cu). Bonding medium 38 can also be a polymer material, for example a silicone-based material or an organic polymer, for example an epoxy resin.

Figure 5:
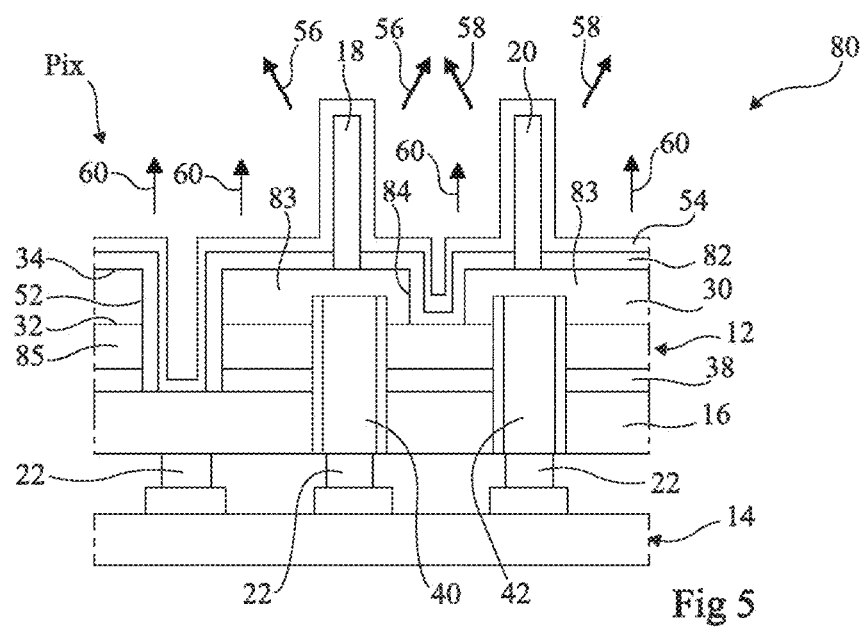
FIGS. 5 and 6 are respectively a partial simplified cross-section view and a partial simplified top view of another embodiment of an optoelectronic device.
Figure 6:
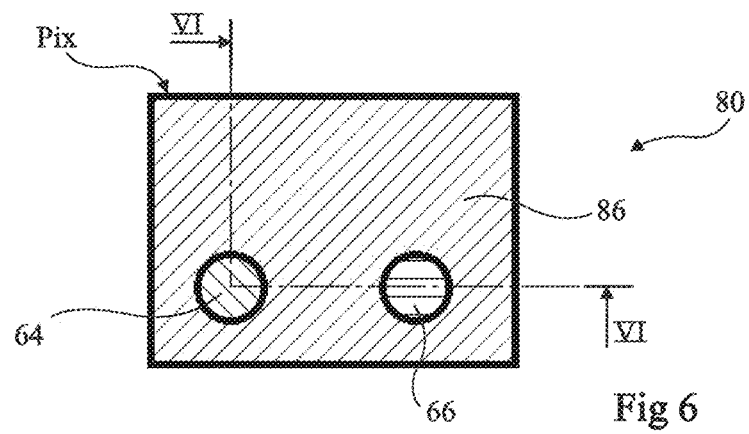

FIGS. 5 and 6 show another embodiment of an optoelectronic device 80 comprising all the elements of optoelectronic device 10 with the difference that conductive layer 54 is electrically insulated from substrate 30 by an electrically insulating layer 82, in that it comprises an opening 84 crossing through substrate 30 from face 32 to face 34, in that substrate 30 is divided in two distinct portions 83 by insulating layer 82 extending inside openings 52 and 84, substrate portions 83 being electrically linked to light-emitting diodes 18, 20 and in that vertical isolated trenches 40, 42 are electrically linked to the substrate portions 83, vertical isolated trenches 40, 42 extending from face 32 and stopping inside one of the substrate portions 83.

In FIG. 5, a support block 85 is shown between substrate 30 and bonding medium 38. Moreover, according of the material composing substrate 30, seed pads 48, 50 may not be present and substrate 30 may be in direct contact with light-emitting diodes 18, 20.

In the embodiment shown in FIG. 5, substrate 30, conductive layer 54, insulating layer 82 and support block 85, when present, are at least partially transparent to the light emitted by light-emitting diode 16.

Support block 85 is in a material adapted to the formation of light-emitting diodes 18, 20. Support block 85 is for example an electrically conductive, semiconductor or insulating substrate, such as a sapphire, silicon carbide, zinc oxide, glass, gallium nitride or aluminum nitride, substrate.

As for optoelectronic device 10, in optoelectronic device 80, conductive layer 54 is a common electrode for light-emitting diodes 16, 18, 20 and active matrix addressing scheme can be performed.

FIG. 6 schematically shows by hatched areas 86, 64, and 66 the areas of pixel Pix from which light, emitted respectively by light-emitting diodes 16, 18, 20, escapes from pixel Pix. In the present embodiment, the area of pixel Pix from which light emitted by light-emitting diode 16 escapes from pixel Pix associated is substantially equal to the surface area of the display pixel Pix.

Figure 7:
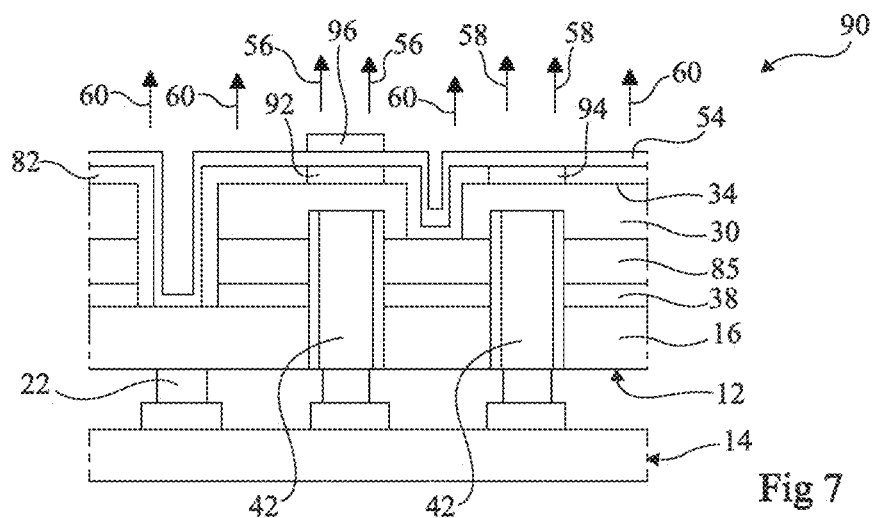
FIGS. 7 to 13 are partial simplified cross-section views of other embodiments of optoelectronic devices.

FIG. 7 shows another embodiment of an optoelectronic device 90 comprising all the elements of optoelectronic device 80 with the difference that tridimensional light-emitting diodes 18, 20 are replaced by planar light-emitting diodes 92, 94, comprising semiconductor layers in an epitaxial relationship with substrate 30. Each light-emitting diode 92, 94 can have the same structure as shown in FIG. 3 and, in particular, can comprise a single quantum well or several quantum wells. Each light-emitting diode 92, 94 is sandwiched between substrate 30 and conductive layer 54.

In the embodiment shown in FIG. 7, light-emitting diodes 92, 94 emit a light at the same wavelength. The manufacturing method of optoelectronic device 90 is then simplified. Optoelectronic device 90 comprises a photoluminescent block 96 resting on conductive layer 54 and facing light-emitting diode 92 and adapted to convert by optical pumping the radiation emitted by light-emitting diode 92 into a desired radiation. Photoluminescent block 96 may comprise confinement means. Photoluminescent block 96 may comprise a single quantum well or multiple quantum wells. The materials of the layers of photoluminescent block 96 depend on the desired wavelength of the radiation emitted by photoluminescent block 96 and the wavelength of the radiation received by photoluminescent block 96. The height of photoluminescent block 96, measured in a direction orthogonal to face 34, is in the range from 50 nm to 500 µm. Photoluminescent block 96 can be pick and placed onto optoelectronic device 90.

As for optoelectronic device 10, in optoelectronic device 90, conductive layer 54 is a common electrode for light-emitting diodes 16, 92, 94 and active matrix addressing scheme can be performed.

Figure 8:
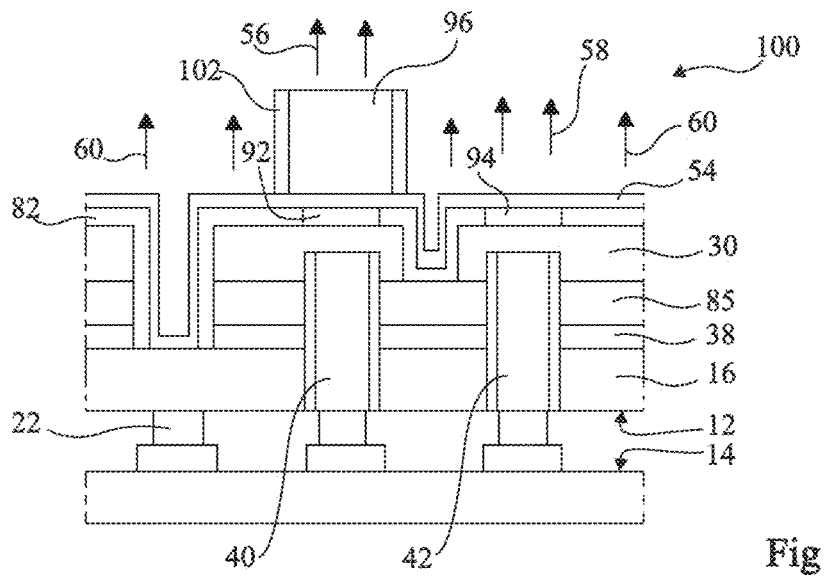

FIG. 8 shows another embodiment of an optoelectronic device 100 comprising all the elements of optoelectronic device 90 with the difference that photoluminescent block 96 comprises a matrix having micrometer-range photoluminescent particles or nanometer-range monocrystalline particles of a semiconductor material, also called semiconductor nanocrystals, dispersed therein. Photoluminescent block 96 can be surrounded by a wall 102. According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum boxes or quantum dots.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide (AgInS$_2$), indium gallium nitride (InGaN) and a mixture of at least two of these compounds. The matrix is made of an at least partly transparent material. The matrix is for example made of silica. The matrix is for example made of any at least partly transparent plastic material, particularly of an at least partly transparent polymer, particularly of silicone, of polyacetic acid (PLA), of acrylic polymers, for example poly(methyl methacrylate) (PMMA). The matrix may be made of an at least partly transparent polymer used with three-dimensional printers, such as PLA.

According to an embodiment, wall 102 may be made of a reflecting material or covered by a reflecting coating for the wavelengths of the radiations emitted by photoluminescent block 96. Moreover, wall 102 can be opaque to the light emitted by light-emitting diode 94. Wall 102 may be made of a conductive material, for example a metal such as aluminum, silver, copper, or zinc. The height of wall 102, measured in a direction orthogonal to face 34, is in the range from 1 µm to 200 µm, preferably from 5 µm to 30 µm. The thickness of wall 102, measured in a direction parallel to face 34, is in the range from 100 nm to 50 µm, preferably from 1 µm to 10 µm.

As for optoelectronic device 10, in optoelectronic device 100, conductive layer 54 is a common electrode for light-emitting diodes 16, 92, 94 and active matrix addressing scheme can be performed.

Figure 9:
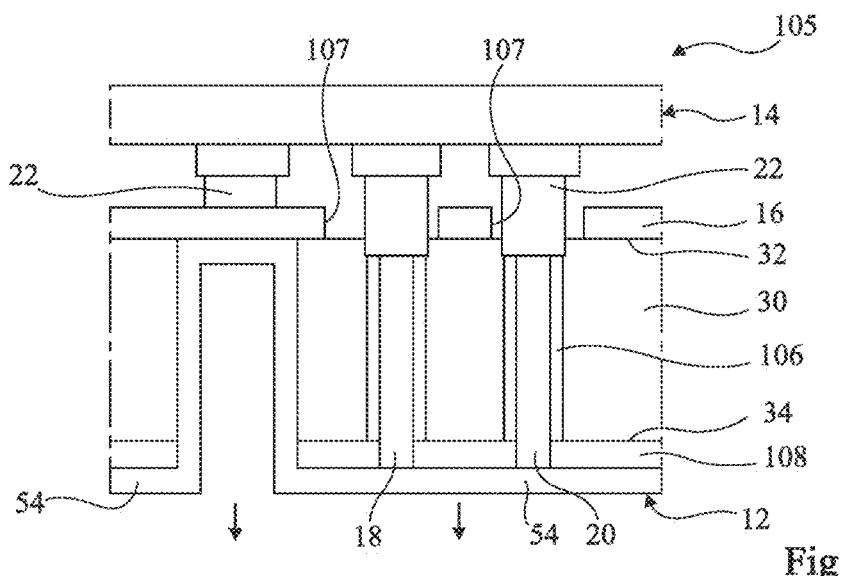

FIG. 9 shows another embodiment of an optoelectronic device 105 comprising all the elements of optoelectronic device 10 with the difference that the substrate 30 is in an electrically insulating material. Moreover, trenches 40, 42 are not present and light-emitting diode 18, 20 extends through substrate 30 from face 32 to face 34. Moreover, the lateral sides of each light-emitting diode 18, 20 are surrounded by an electrically conducting and transparent layer 106 and in contact with conducting layer 106, conducting layers 106 being in contact with bonding pads 22 through openings 107 provided in light-emitting diode 16. Further, face 34 is covered by an electrically insulating layer 108 interposed between conductive layer 54 and conducting layer 106, each light-emitting diode 18, 20 being in contact with conductive layer 54 through insulating layer 108. Insulating layer 108 can have a multilayer structure.

In operation, light is emitted downward by optoelectronic circuit 12 in FIG. 9. As for optoelectronic device 10, in optoelectronic device 105, conductive layer 54 is a common electrode for light-emitting diodes 16, 18, 20 and active matrix addressing scheme can be performed.

Figure 10:
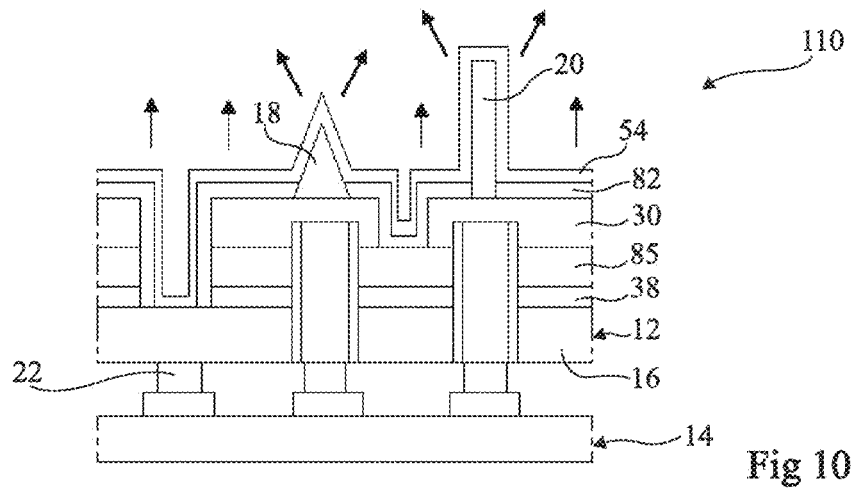

FIG. 10 shows another embodiment of an optoelectronic device 110 comprising all the elements of optoelectronic device 80 with the difference that light-emitting diodes 18, 20 are tridimensional light-emitting diodes in which active regions are formed on tridimensional semiconductor elements of different shapes. In the embodiment shown in FIG. 10, light-emitting diode 18 has a pyramid shape and light-emitting diode 20 has a wire shape. The shapes of the semiconductor elements can be chosen so that the crystalline planes of the active regions are the most adapted for the emission of light according to the wavelength of the emitted light. As for optoelectronic device 10, in optoelectronic device 110, conductive layer 54 is a common electrode for light-emitting diodes 16, 18, 20 and active matrix addressing scheme can be performed.

Figure 11:
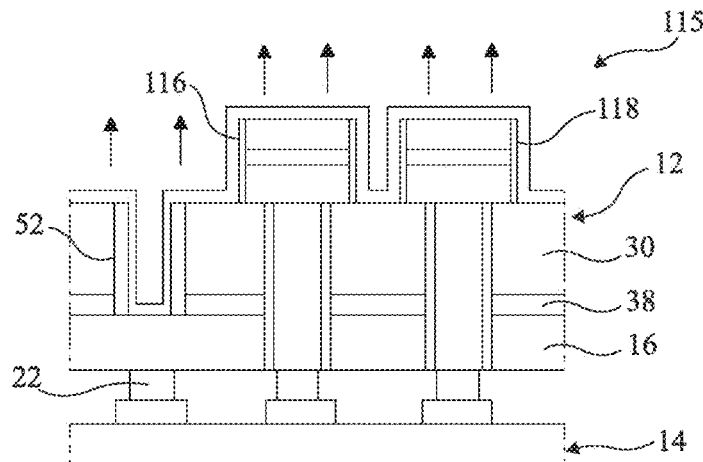

FIG. 11 shows another embodiment of an optoelectronic device 115 comprising all the elements of optoelectronic device 10 with the difference that substrate 30 is in an electrically insulating material, in that light-emitting diodes 18, 20 are replaced by optoelectronic components 116, 118 fixed to substrate 30, for example by a pick and place method. Light-emitting diodes 116, 118 can be planar light-emitting diodes having the structure shown on FIG. 3. As for optoelectronic device 10, in optoelectronic device 115, conductive layer 54 is a common electrode for light-emitting diodes 16, 18, 20 and active matrix addressing scheme can be performed.

Figure 12:
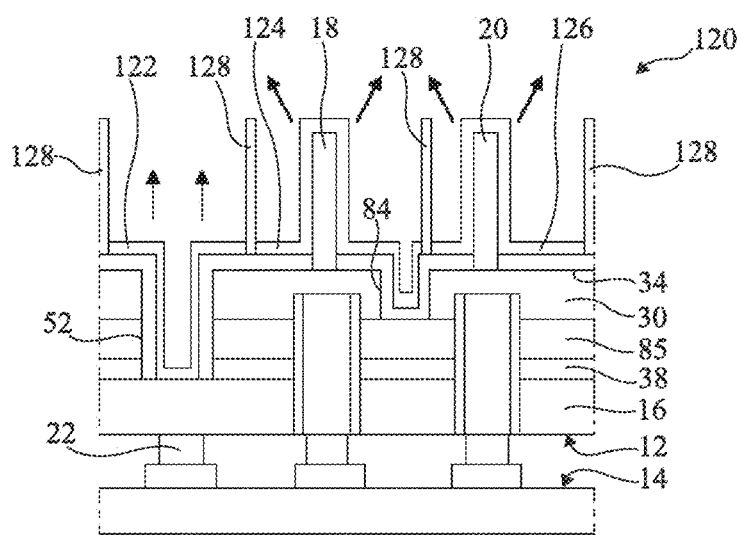

FIG. 12 shows another embodiment of an optoelectronic device 120 comprising all the elements of optoelectronic device 80 with the difference that conductive layer 54 is replaced by electrically conductive layers 122, 124, 126, conductive layer 122 being in contact with light-emitting diode 16 at the bottom of opening 52, conductive layer 124 being in contact with light-emitting diode 18 and conductive layer 126 being in contact with light-emitting diode 20. Optoelectronic device 120 can further comprise walls 128 extending from face 34 and interposed between opening 52, light-emitting diode 18 and light-emitting diode 20.

According to an embodiment, walls 128 may be made of a reflecting material or covered by a reflecting coating for the wavelengths of the radiations emitted by light-emitting diodes 18, 20. Walls 128 may be made of a conductive material, for example a metal such as aluminum, silver, copper, or zinc. The height of walls 128, measured in a direction orthogonal to face 34, is in the range from 1 μm to 200 μm, preferably from 5 μm to 30 μm. The thickness of walls 128, measured in a direction parallel to face 34, is in the range from 100 nm to 50 μm, preferably from 1 μm to 10 μm. In optoelectronic device 120, a passive matrix addressing scheme can be performed. As a variation, light-emitting diodes 18, 20 can be replaced by light-emitting diodes 92, 94. Moreover, when substrate 30 or support block 85, when present, is not transparent to the light emitted by light-emitting diode 16, a reflecting mirror can be provided as in optoelectronic device 10.

Figure 13:
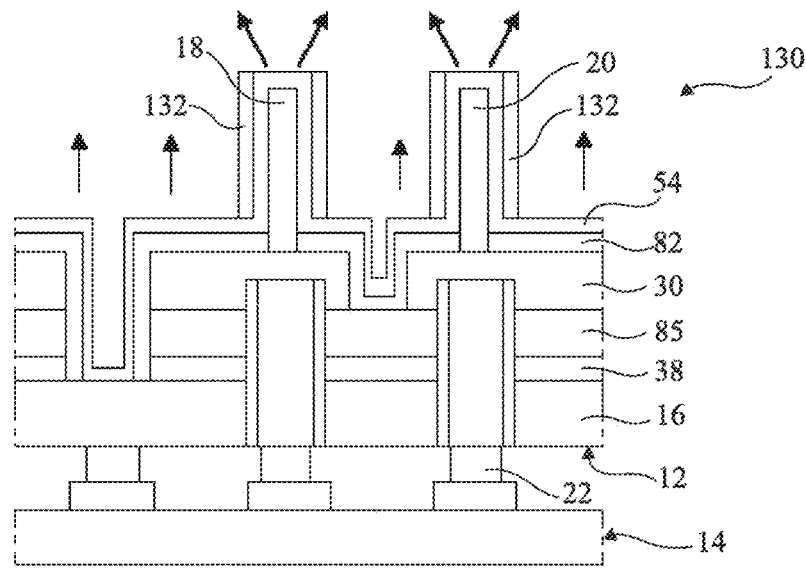

FIG. 13 shows another embodiment of an optoelectronic device 130 comprising all the elements of optoelectronic device 80, each light-emitting diode 18, 20 being further surrounded by a sleeve 132 in contact with conductive layer 54. Sleeves 132 can be metallic. Sleeves 132 allows parasitic optical pumping to be prevented. An electrically insulating layer, not shown, can be interposed between conductive layer 54 and sleeves 132 to reduce absorption due to waveguiding effect.

FIGS. 14A to 14H are partial simplified cross-section views of the structures obtained at successive steps of an embodiment of a method of manufacturing the optoelectronic device shown in FIG. 5.

Figure 14A:
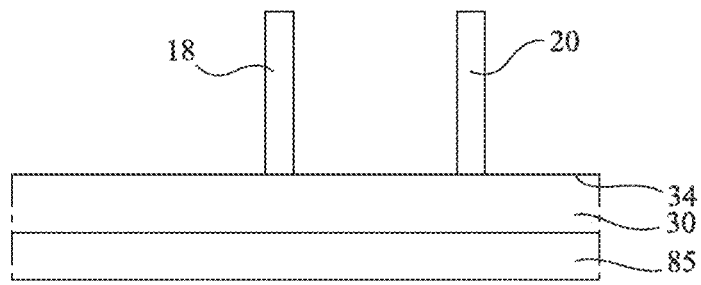
FIGS. 14A to 14H are partial simplified cross-section views of the structures obtained at successive steps of an embodiment of a method of manufacturing the optoelectronic device shown in FIG. 5.
Figure 14B:
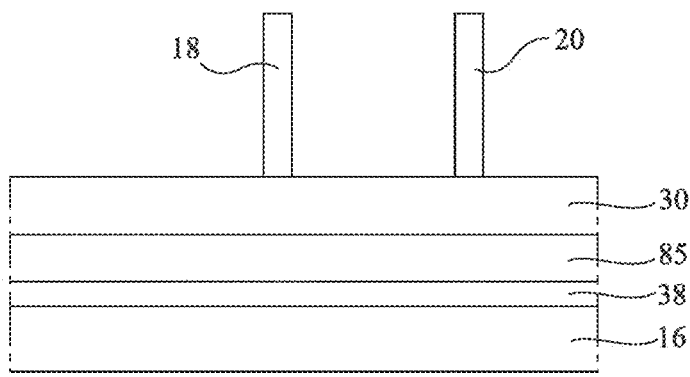
Figure 14C:
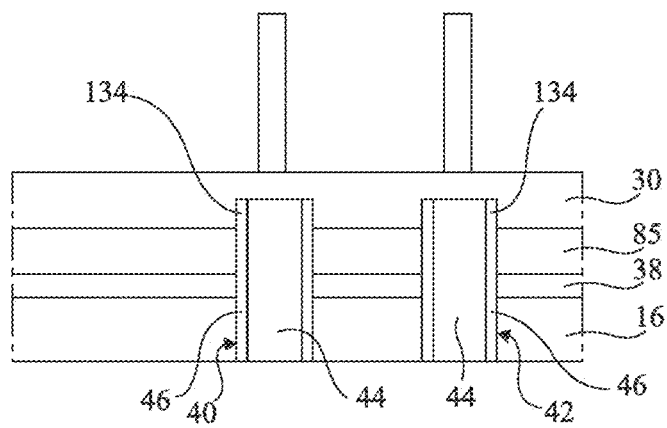
Figure 14D:
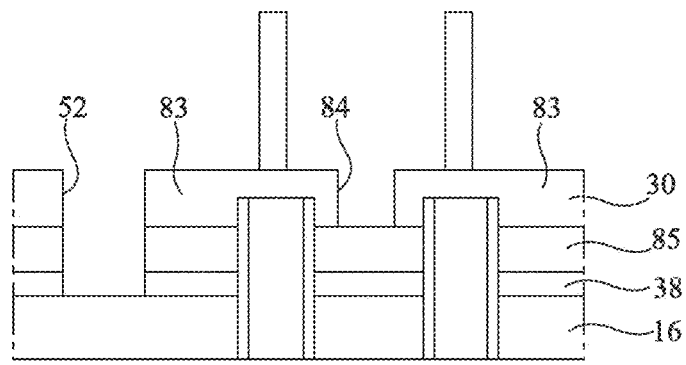
Figure 14E:
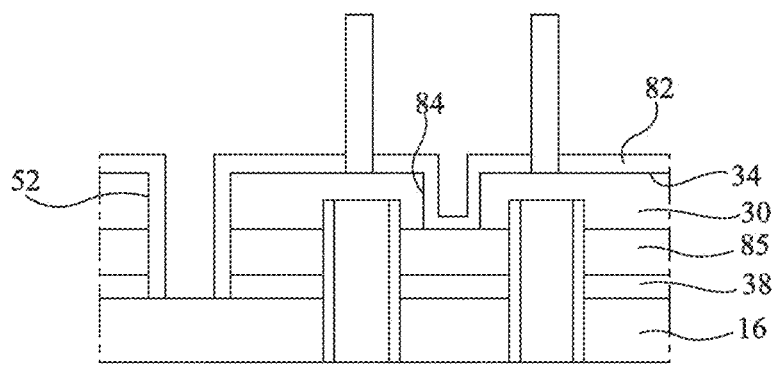
Figure 14F:
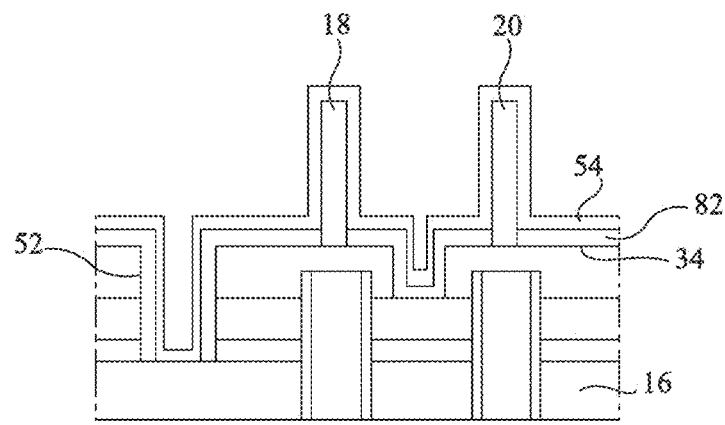
Figure 14G:
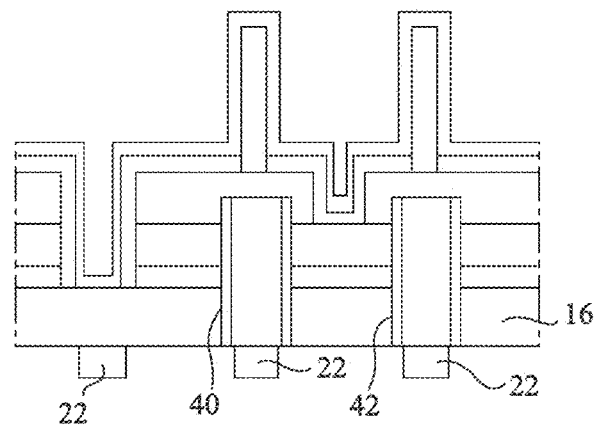
Figure 14H:
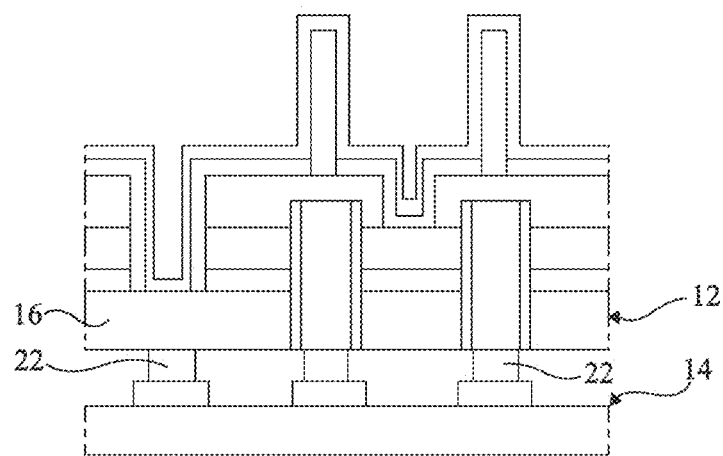

An embodiment of a method of manufacturing the optoelectronic device shown in FIG. 5 comprises the successive following steps, made for each display pixel Pix:

a) Forming light-emitting diodes 18, 20 on face 34 of substrate 30, preferentially using growth method at low temperature (FIG. 14A). Layers of light-emitting diodes 18, 20 may be grown by a method such as chemical vapor deposition (CVD) or metal-organic chemical vapor deposition (MOCVD), also known as metal-organic vapor phase epitaxy (MOVPE). However, methods such as molecular-beam epitaxy (MBE), gas-source MBE (GSMBE), metal-organic MBE (MOMBE), plasma-assisted MBE (PAMBE), atomic layer epitaxy (ALE), hydride vapor phase epitaxy (HYPE) may be used, as well as an atomic layer deposition (ALD). Further, electrochemical processes may be used, for example, chemical bath deposition (CBD), hydrothermal processes, liquid aerosol pyrolysis, or electro-deposition. In an embodiment, a least a layer of light-emitting diodes 18, 20 is linked to substrate 30 by an epitaxial relationship.

b) Bonding light-emitting diode 16 to support block 85, when present, or to face 32 of substrate 30, when support block 85 is not present, by bonding medium 38 (FIG. 14B). Light-emitting diode 16 can be grown using a host substrate, for example a GaAs host substrate, which is subsequently removed, before or after the bonding of light-emitting diode 16 to support block 85, to avoid absorption therefrom.

c) Forming vertical isolated trenches 40, 42 through light-emitting diode 16, bonding medium 38, support block 85 and partially through substrate 30 (FIG. 14C). Vertical isolated trenches 40, 42 can be formed by etching openings 134 through light-emitting diode 16, support block 85 and partially substrate 30, forming insulating walls 46 inside openings and forming conductive cores 44 between walls 46. The implemented etching may be a dry etching, for example via a plasma based on $Cl_2$ or a reactive ion etching (RIE).

d) Forming openings 84 through substrate 30 up to support block 85 and forming opening 52 in substrate 30, support block 85 and bonding medium 38 up to light-emitting diode 16 to delimit substrate portions 83 (FIG. 14D).

e) Forming insulating layer 82 on face 34, in opening 84 and on the lateral sides of opening 52 (FIG. 14E). For example, insulating layer 82 is formed on the entire structure shown in FIG. 14D and portions of insulating layer 82 covering light-emitting diodes 18, 20 and portion of insulating layer 82 at the bottom of opening 52 are withdrawn.

f) Forming conductive layer 54 on the structure shown in FIG. 14E on the side of face 34, in particular on insulating layer 82, on light-emitting diodes 18, 20 and in the bottom of opening 52 in contact with light-emitting diode 16 (FIG. 14F).

g) Forming bonding pads 22 in contact with light-emitting diode 16 and with vertical isolated trenches 40, 42 (FIG. 14G).

h) Binding control chip 14 to optoelectronic circuit 12 (FIG. 14H). In the present embodiment, the bonding of control chip 14 to light-emitting diode 16 is performed with use of inserts such as bonding pads 22. Alternatively, the bonding of control chip 14 to light-emitting diode 16 may be performed by direct bonding, with no use of inserts. The direct bonding may comprise a direct metal-to-metal bonding of metal areas of control chip 14 and metal areas of light-emitting diode 16 and vertical isolated trenches 40, 42 and a dielectric-to-dielectric bonding of the dielectric areas at the surface of light-emitting diode 16 and of the dielectric areas at the surface of control chip 14. The bonding of control chip 14 to light-emitting diode 16 may be performed by a thermocompression method where light-emitting diode 16 is placed against control chip 14, with a pressure and a heating being applied.

FIGS. 15A to 15L are partial simplified cross-section views of the structures obtained at successive steps of an embodiment of a method of manufacturing optoelectronic device 105 shown in FIG. 9.

Figure 15A:
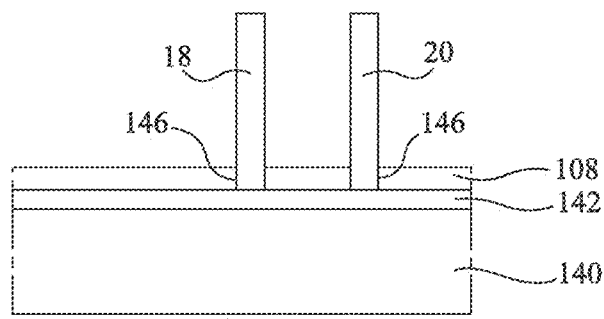
FIGS. 15A to 15L are partial simplified cross-section views of the structures obtained at successive steps of an embodiment of a method of manufacturing optoelectronic device 80 shown in FIG. 9.
Figure 15B:
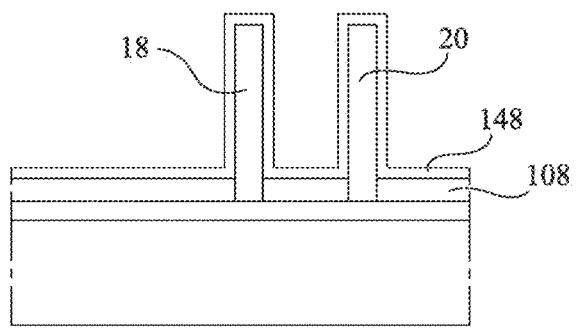
Figure 15C:
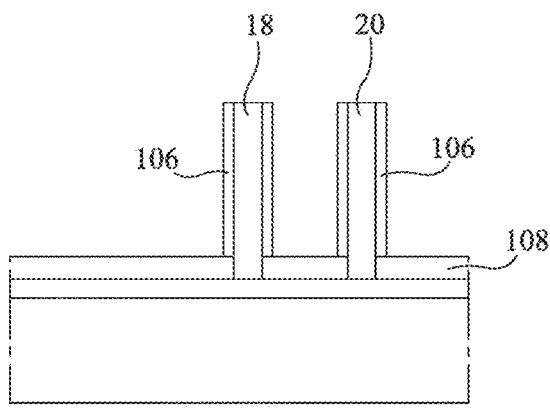
Figure 15D:
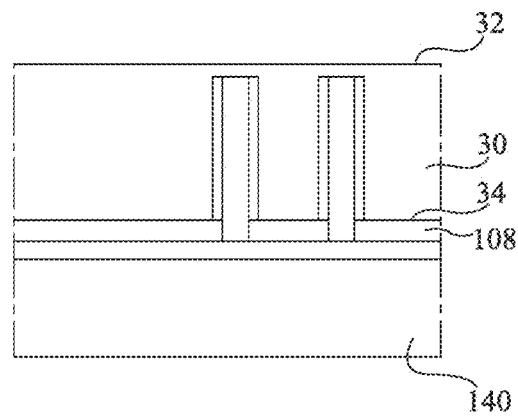
Figure 15E:
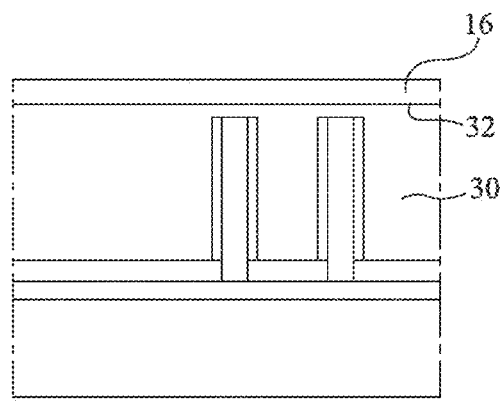
Figure 15F:
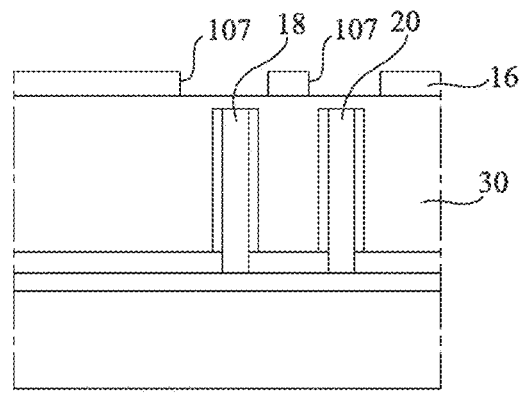
Figure 15G:
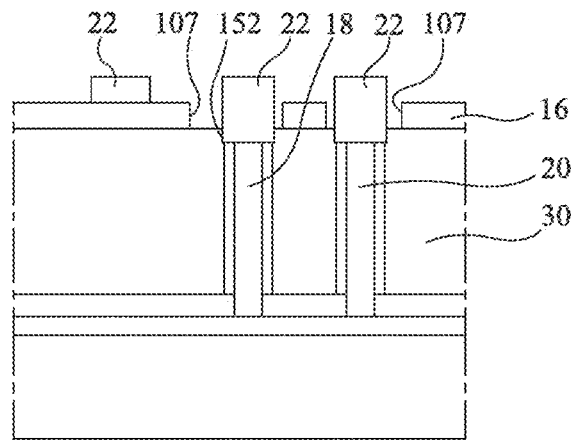
Figure 15H:
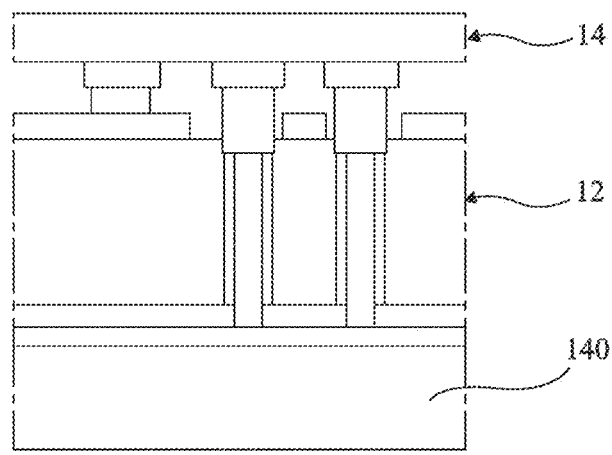
Figure 15I:
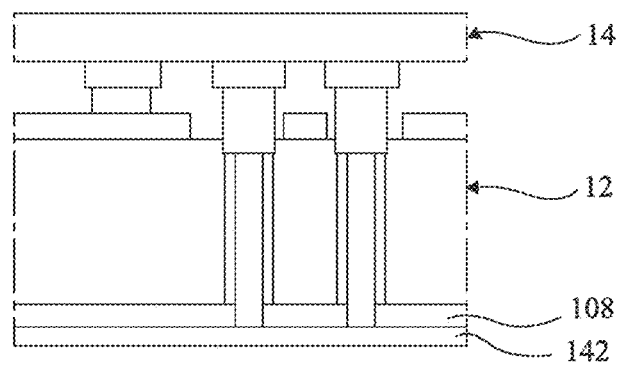
Figure 15J:
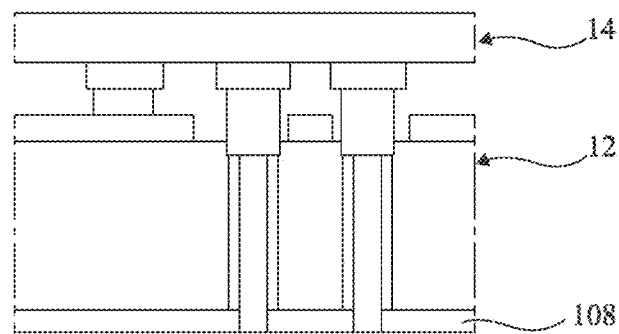
Figure 15K:
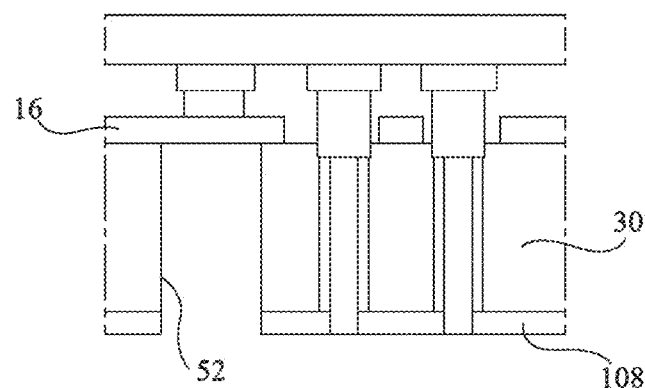
Figure 15L:
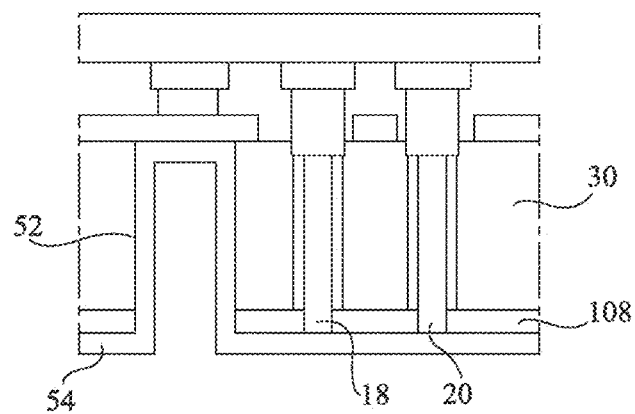

An embodiment of a method of manufacturing the optoelectronic device 105 shown in FIG. 9 comprises the successive following steps, made for each display pixel Pix:

a') providing a substrate 140 covered by a nucleation layer 142 and electrically insulating layer 108, forming openings 146 in insulating layer 108 and forming light-emitting diodes 18, 20 on nucleation layer 142 in openings 146 (FIG. 15A);

b') forming a transparent and conductive layer 148 on the structure shown in FIG. 15A (FIG. 15B);

c') delimiting electrically conducting and transparent layers 106 in layer 148 (FIG. 15C);

d') forming substrate 30 (FIG. 15D);

e') bonding light-emitting diode 16 to face 32 of substrate 30 (FIG. 15E);

f') forming openings 107 in light-emitting diode 16 facing light-emitting diodes 18, 20 (FIG. 15F);

g') forming, in openings 107, openings 152 in substrate 30 to expose light-emitting diodes 18, 20 and forming bonding pads 22 in contact with light-emitting diode 16, 18, 20 (FIG. 15G);

h') binding control chip 14 to optoelectronic circuit 12 (FIG. 15H).

i') withdrawing substrate 140 (FIG. 15I);

j') withdrawing nucleation layer 142 (FIG. 15J);

k') forming opening 52 through insulating layer 108 and substrate 30 up to light-emitting diode 16 (FIG. 15K); and l') forming conductive layer 54 on the structure shown in FIG. 15K on face 34, in particular on insulating layer 108, in contact with light-emitting diodes 18, 20 and in the bottom of opening 52 in contact with light-emitting diode 16 (FIG. 15L).

Specific embodiments have been described. Various alterations and modifications will occur to those skilled in the art. In particular, although in the previously-described embodiments, walls 128 have lateral faces that are substantially orthogonal to face 34, lateral faces of walls 128 may be profiled, for example inclined with respect to face 34.

Moreover, several embodiments with various alterations have been described. Some elements of these embodiments and alterations can be combined. As an example, light-emitting diodes 18, 20 of optoelectronic device 10 can be replaced by light-emitting diodes 92, 94 of optoelectronic device 90.

The invention claimed is:

1. An optoelectronic device comprising:
a first circuit comprising a substrate comprising first and second opposite faces, the first circuit comprising display pixels, each display pixel comprising, on the side of the first face, a first light-emitting diode comprising a first active region adapted to emit a first radiation at a first wavelength in the range from 600 nm to 720 nm and, extending from the second face, a second light-emitting diode comprising a second active region adapted to emit a second radiation, the second light-emitting diode having a tridimensional structure and comprising a tridimensional semiconductor element, covered by the second active region and having a microwire shape, or a nanowire shape, or a pyramidal shape, the surface area, viewed from a direction orthogonal to the first face, of the first active region being at least twice as big as the surface area, viewed from said direction, of the second active region; and
a second circuit bonded to the first circuit on the side of the first light-emitting diode and electrically linked to the first and second light-emitting diodes.

2. The optoelectronic device of claim 1, wherein the first light-emitting diode has a planar structure.

3. The optoelectronic device of claim 1, wherein the first circuit further comprises an electrically conductive layer covering the second light-emitting diode and electrically connected to the second light-emitting diode.

4. The optoelectronic device of claim 3, wherein the substrate comprises an opening, the electrically conductive layer being electrically connected to the first light-emitting diode at the bottom of the opening.

5. The optoelectronic device of claim 1, wherein the first light-emitting diode and the second light-emitting diode comprise at least one quantum well.

6. The optoelectronic device of claim 1, wherein each display pixel comprises an electrically conductive element extending from the first face through at least part of the substrate and electrically linked to the second light-emitting diode and to the second circuit.

7. The optoelectronic device of claim 1, wherein each display pixel further comprises a wall at least partially made of a reflecting material at least for the second radiation, said wall delimiting an opening opposite to the second light-emitting diode.

8. The optoelectronic device of claim 1, wherein each display pixel further comprises a photoluminescent block opposite to the second light-emitting diode.

9. The optoelectronic device of claim 1, wherein the second light-emitting diode extends at least partly through the substrate.

10. The optoelectronic device of claim 1, wherein each display pixel further comprises, extending from the second face, a third light-emitting diode comprising a third active region adapted to emit a third radiation, the surface area, viewed from a direction orthogonal to the first face, of the first active region being at least twice as big as the surface area, viewed from said direction, of the third active region.

11. The optoelectronic device of claim 10, wherein the second radiation has a second wavelength in the range from 510 nm to 570 nm and wherein the third radiation has a third wavelength in the range from 430 nm to 490 nm.

12. The optoelectronic device of claim 1, wherein the surface area, viewed from a direction orthogonal to the first face, of the first active region is at least five times as big as the surface area, viewed from said direction, of the second active region.

13. The optoelectronic device of claim 1, wherein the active region of the second light-emitting diode covers at least two surfaces of the tridimensional semiconductor element.

14. A method of manufacturing an optoelectronic device comprising the steps of:
a) forming a first circuit comprising a substrate comprising first and second opposite faces, the first circuit comprising display pixels, each display pixel comprising, on the side of the first face, a first light-emitting diode comprising a first active region adapted to emit a first radiation at a first wavelength in the range from 600 nm to 720 nm and, extending from the second face, a second light-emitting diode comprising a second active region adapted to emit a second radiation, the second light-emitting diode having a tridimensional structure and comprising a tridimensional semiconductor element covered by the second active region and having a microwire shape, or a nanowire shape, or a pyramidal shape, the surface area, viewed from a direction orthogonal to the first face, of the first active region being at least twice as big as the surface area, viewed from said direction, of the second active region; and b) bonding a second circuit to the first circuit on the side of the first light-emitting diode, the second circuit being, after step b), electrically linked to the first and second light-emitting diodes.

\* \* \* \* \*